United States Patent [19]

Davie

[11] Patent Number: 4,890,043

[45] Date of Patent: Dec. 26, 1989

[54] ARRANGEMENT FOR GENERATING A SAWTOOTH CURRENT

[75] Inventor: Alan J. Davie, Orpington, England

[73] Assignee: U.S. Philips Corporation, New York, N.Y.

[21] Appl. No.: 266,182

[22] Filed: Nov. 2, 1988

[30] Foreign Application Priority Data

Dec. 18, 1987 [GB] United Kingdom ............... 8729516

[51] Int. Cl.⁴ .................... H01J 29/70; H01J 29/76
[52] U.S. Cl. .................................................. 315/408
[58] Field of Search ............................. 315/408, 399

[56] References Cited

U.S. PATENT DOCUMENTS 4,400,652 8/1983 Sunderland .
4,572,994 2/1986 Valkestijn et al. ................. 315/411
4,590,408 5/1986 Mays .
4,607,195 8/1986 Valkestijn et al. ................. 315/410

Primary Examiner—Theodore M. Blum
Attorney, Agent, or Firm—Edward W. Goodman

[57] ABSTRACT

A line deflection stage includes a line oscillator (LO), a driver (DR) and a line output transistor (TR1) the collector of which is connected through the parallel arrangement of a switching transistor (TR2) and a diode (D3) to a line deflection coil (Ly) and a scan capacitor ($C_s$). The deflection coil (Ly) and scan capacitor ($C_s$) are shunted by a diode (D2) while a flyback capacitor ($C_f$) is connected across the emitter-collector path of transistor (TR1). The line oscillator (LO) output is also applied to an input of a flyback time controller (TC) which produces a pulse output under the control of a control input (C). This pulse output is amplified by a further transistor (TR3) and an associated transformer (T) and applied to the base of transistor (TR2) to cut this transistor off for a controlled part of the flyback period to prevent the flyback capacitor from immediately discharging and hence extend the flyback period.

5 Claims, 3 Drawing Sheets

1-III-PHB 33416

ARRANGEMENT FOR GENERATING A SAWTOOTH CURRENT

BACKGROUND OF THE INVENTION

1. Field of the Invention

The present invention relates to an arrangement for generating a sawtooth current having a stroke period and a flyback period through an inductive load, said arrangement comprising said inductive load, a storage capacitor, a unidirectional device through which said sawtooth current flows during a first part of each stroke period, a controlled switch through which said sawtooth current flows during a second part of each stroke period, a flyback capacitor connected in parallel with the main current path of said controlled switch, and a pulse source for supplying a pulse train for controlling the switching of said controlled switch.

2. Description of Related Art

Such arrangements are well known and can take the form of a line deflection stage where the inductive load is formed by the line deflection coils and the storage capacitor is formed by the scan or trace capacitor. A stage of this type is normally arranged to operate at a single line frequency with a fixed flyback period being determined by the inductance and capacitance in the circuit and principally the flyback capacitor. When such a deflection stage is used for data graphics display, there might be the requirement that the flyback time may be changed due to different input signal requirements. One example of this could be where the line frequency may be changed from time to time, in which case the flyback period would also need to be changed to achieve a given flyback period to scan period ratio. Such changes to the flyback period have in the past been achieved by changing the value of the flyback capacitor which can also require a switching arrangement to effect the change of capacitance which would give a single defined flyback time for each capacitance value.

SUMMARY OF THE INVENTION

It is an object of the invention to provide an arrangement where the change of the flyback period can be achieved without changing the capacitance value of the flyback capacitor.

The invention provides an arrangement for generating a sawtooth current having a stroke period and a flyback period through an inductive load, said arrangement comprising said inductive load, a storage capacitor, a unidirectional device through which said sawtooth current flows during a first part of each stroke period, a controlled switch through which said sawtooth current flows during a second part of each stroke period, a flyback capacitor connected in parallel with a main current path of said controlled switch, and a pulse source for supplying a pulse train for controlling a switching of said controlled switch, characterized in that said arrangement additionally comprises switch means by which the flyback capacitor can be electrically isolated periodically from the inductive load and the storage capacitor when the voltage across the flyback capacitor has reached its peak value, and for reconnecting the flyback capacitor thereto after a finite period for extending the flyback period.

Such an arrangement has the advantage that only one flyback capacitor is required for various flyback periods and there is thus no need to provide a switching arrangement to switch between a number of flyback capacitors. A further advantage is that the peak voltage across the controlled switch is only proportional to the stroke period instead of being proportional to the stroke period divided by the flyback period as is the normal situation and, as a result, is considerably less effected by small order flyback period changes.

In one embodiment of the invention, the switch means comprises a bipolar transistor whose emitter-collector path is connected between said flyback capacitor and said inductive load, and a flyback time controller providing a pulse output for rendering said transistor non-conducting at or before the time at which said peak value is reached and conducting at said finite period after said time. The pulse train from the pulse source may then be applied to an input of said flyback time controller, the edge in the pulse train used to switch off said controlled switch being used to produce an edge in the pulse output from said flyback time controller to render said transistor non-conducting while an edge in said pulse output to render said transistor conducting is produced in response to a further input.

Such an embodiment may require the pulse output of the flyback time controller to be amplified prior to it being applied to the transistor.

In a further embodiment of the invention, the switch means comprises a thyristor whose main current path is connected between said flyback capacitor and said inductive load, and a flyback time controller providing a trigger pulse for rendering said thyristor conducting at the end of said finite period, said thyristor having become non-conducting during the stroke period when the polarity of the sawtooth current changes. The pulse train from said pulse source may then be applied as a gating pulse to an input of said flyback time controller, the controller producing the trigger pulse outside the period of said gating pulse.

Such an embodiment has the advantage that the trigger pulse may be a short, predefined pulse instead of a signal with a specific duty cycle.

BRIEF DESCRIPTION OF THE DRAWINGS

The invention will now be described, by way of example, with reference to the accompanying drawings, in which.

DESCRIPTION OF THE PREFERRED EMBODIMENT

Figure 1:
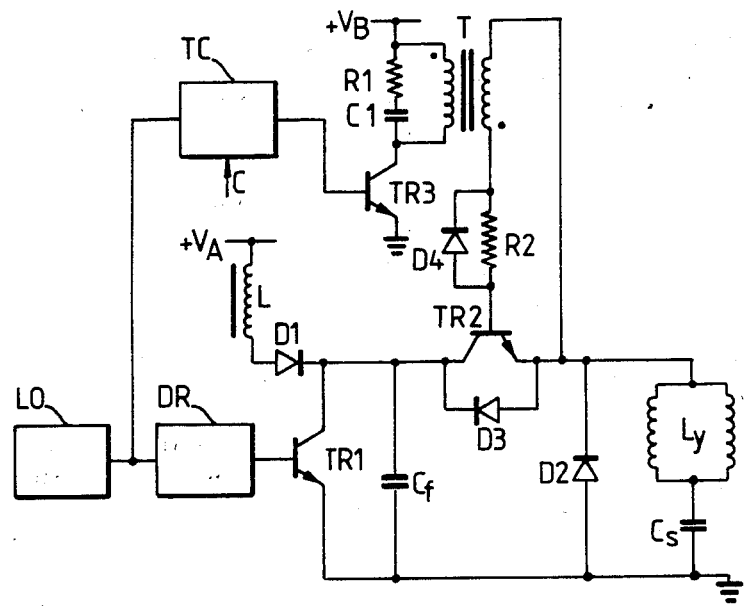
FIG. 1 is a circuit diagram, partly in block form, of a line deflection stage according to the invention.

FIG. 1 shows a line deflection stage comprising a line oscillator LO which provides a pulse train at the appropriate line frequency. This pulse train is applied to a line driver circuit DR whose output provides drive pulses which are applied to the base of an n.p.n. bipolar line output transistor TR1 whose emitter is connected to ground. The collector of transistor TR1 is connected through a diode D1 and an inductor L to the positive supply voltage line $+V_A$, the negative line for which is connected to ground, this collector also being connected to the collector of a further n.p.n. bipolar transistor TR2. A flyback capacitor $C_f$ is connected between the emitter and collector electrodes of transistor TR1. The emitter of transistor TR2 is connected to a line deflection coil Ly which, in turn, is connected through a scan capacitor $C_s$ to earth while a diode D2, poled in the manner shown, is connected in parallel with the deflection coil Ly and scan capacitor $C_s$. A further diode D3, poled in the manner shown, is connected between the emitter and collector electrodes of transistor TR2.

The pulse train output of line oscillator LO is additionally applied to an input of a flyback time controller TC to a further input C of which a control voltage or signal is applied. The nature and operation of the flyback time controller TC will be described below in more detail. The pulse output of the controller TC is applied to the base of a further n.p.n. bipolar transistor TR3 whose collector is connected through the primary of a transformer T to the positive line of a low voltage supply $+V_B$ the primary being shunted by the series arrangement of a resistor R1 and a capacitor C1 for damping purposes. One end of the secondary of transformer T is connected to the emitter of transistor TR2 while the other end is connected through the parallel arrangement of a diode D4, poled in the manner shown, and a resistor R2 to the base of transistor TR2.

In considering the operation of the line output stage, it will initially be assumed that transistor TR2 conducts the whole time to provide a short circuit path across diode D3. The line output stage then operates in known manner with the voltage stored in scan capacitor $C_s$ producing the required sawtooth current through deflection coil Ly which initially flows through the diode D2 for a first part of a trace period and subsequently through transistor TR1 for a second part of the trace period. The flyback period is initiated at the instant transistor TR1 becomes non-conducting, this transistor TR1 having been previously rendered conductive prior to or at the commencement of the second part of the trace period, under the control of drive pulses from the driver circuit DR. During the flyback period, the inductance and capacitance in the line output circuit resonate to produce a half sine wave flyback pulse which is followed by the start of a further scan period.

Figure 2:
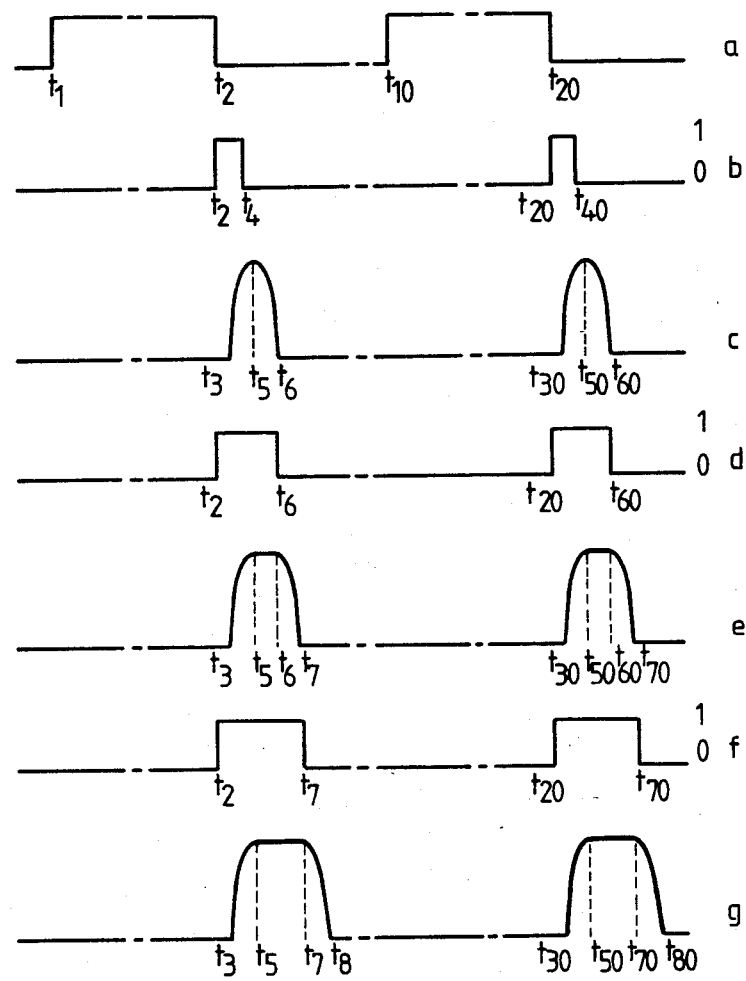
FIGS. 2a–2g show waveforms associated with the circuit of FIG. 1.

If prior to the peak of the half sine wave flyback pulse transistor TR2 is rendered non-conducting, then once this peak voltage has been reached (which voltage has been conveyed by diode D3), the voltage stored across the flyback capacitor $C_f$ is isolated from the rest of the line output circuit and cannot discharge until transistor TR2 is again rendered conducting, this stored voltage being prevented from leaking away through inductor L by the diode D1. By controlling the period over which transistor TR2 is held non-conducting, the length of the flyback pulse may also be controlled so as to lengthen the flyback period over what it would have been with transistor TR2 permanently conducting or conducting for a relatively short period. The method by which this can be achieved with the line deflection stage of FIG. 1 will be described with additional reference to FIG. 2 which shows waveforms associated with the deflection stage.

FIG. 2a shows pulses of the line frequency pulse train present at the output of the line oscillator LO and which may conveniently have a 1:1 mark-to-space ratio. These pulses are amplified by the driver stage DR and applied to the base of transistor TR1, the rising edges $t_1$, $t_{10}$ rendering the transistor TR1 conducting while the falling edges $t_2$, $t_{20}$ render the transistor non-conducting to initiate the flyback period. FIG. 2c shows the flyback pulse present at the collector of transistor TR1 from which it will be seen that this transistor TR1 does not cease to conduct until time $t_3$, $t_{30}$ due to the charge carriers in the transistor TR1. The line frequency pulse train is also applied to the flyback time controller TC which may be in the form of a flip-flop where the falling edges of this pulse train set the flip-flop into its '1' state while the time at which it is set into its '0' state is governed by the magnitude of a voltage applied to the control input C. Controller pulse outputs of various durations are shown in FIGS. 2b, 2d and 2f, these being applied to the base of transistor TR3 in which they are amplified and used to drive transistor TR2 by way of transformer T. Diode D4, resistor R2 and the leakage inductance of transformer T control the charge storage time of transistor TR2 and hence its turn-off characteristic as disclosed in our United Kingdom patent GB No. A 1 234 607. The drive to the base of transistor TR2 is arranged such that when the controller pulse output is in the '1' state the transistor is non-conducting and when in the '0' state the transistor conducts.

In the case of FIG. 2b, transistor TR2 is only non-conducting for a short period between times $t_2$ and $t_4$, $t_{20}$ and $t_{40}$ and as the transistor TR2 conductors prior to the peak $t_5$, $t_{50}$ of the flyback pulse, the flyback period is that as determined by the capacitance and inductive components of the deflection circuit and the flyback pulse is a normal half sine wave terminating at $t_6$, $t_{60}$ as shown in FIG. 2c. For the case of FIG. 2d, the transistor TR2 is non-conducting for a longer period between times $t_2$ and $t_6$, $t_{20}$ and $t_{60}$ which includes the time $t_5$, $t_{50}$ at which the flyback pulse $t_5$, $t_{50}$ has reached its peak (FIGS. 2e). The charge on capacitor $C_f$ cannot start to flow through transistor TR2 until times $t_6$, $t_{60}$ when it again conducts, and the flyback period finally ends at $t_7$, $t_{70}$ so extending the duration of the flyback pulse over the case of FIG. 2c. Yet a further extension of the flyback period is achieved in the case where transistor TR2 is non-conducting between period $t_2$ and $t_7$, $t_{20}$ and $t_{70}$ as shown in FIG. 2f such that the flyback pulse finally ends at times $t_8$, $t_{80}$.

The line deflection stage of FIG. 1 may be used with different line frequencies and in particular with multi-line frequency data graphic displays where the flyback period can be increased as the line frequency is lowered to prevent the need to make the display substantially over-scan thereby enabling the supplied video data to exploit the full useful display area on the picture tube. It can also be used with single frequency line deflection stages where the ratio between the scan and flyback period can be changed to accommodate different vision periods per line from different vision sources. The control voltage applied to the control input C of flyback time controller TC can be derived from a variable voltage source which can be manually adjusted or can be derived from the vision signal. In the latter case, the control voltage may reflect the length of the blanking period.

In the above description of FIG. 1, the transistor TR2 is driven from the output of flyback time controller TC by way of a driver stage comprising transistor TR3, transformer T and associated components. If the single transistor TR2 were replaced by a multiple transistor of Darlington configuration then it could be possible to drive such a multiple transistor directly from the output of the time controller TC.

Figure 3:
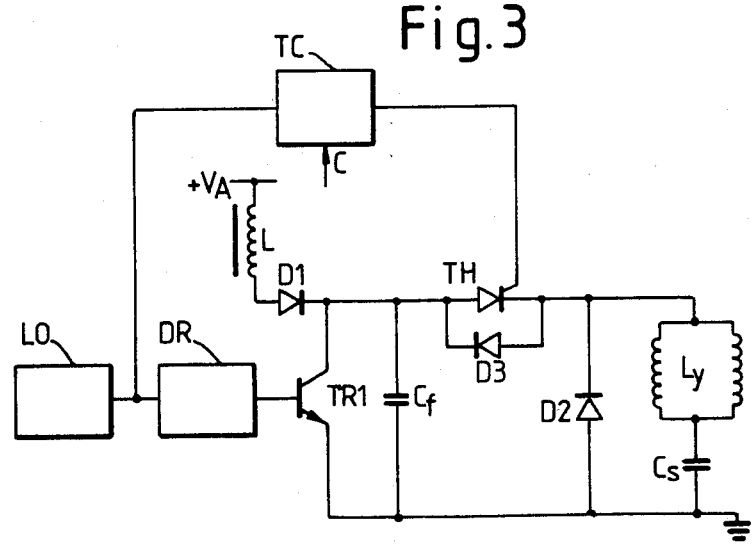
FIG. 3 is a modification of the circuit shown in FIG. 1.
Figure 4:
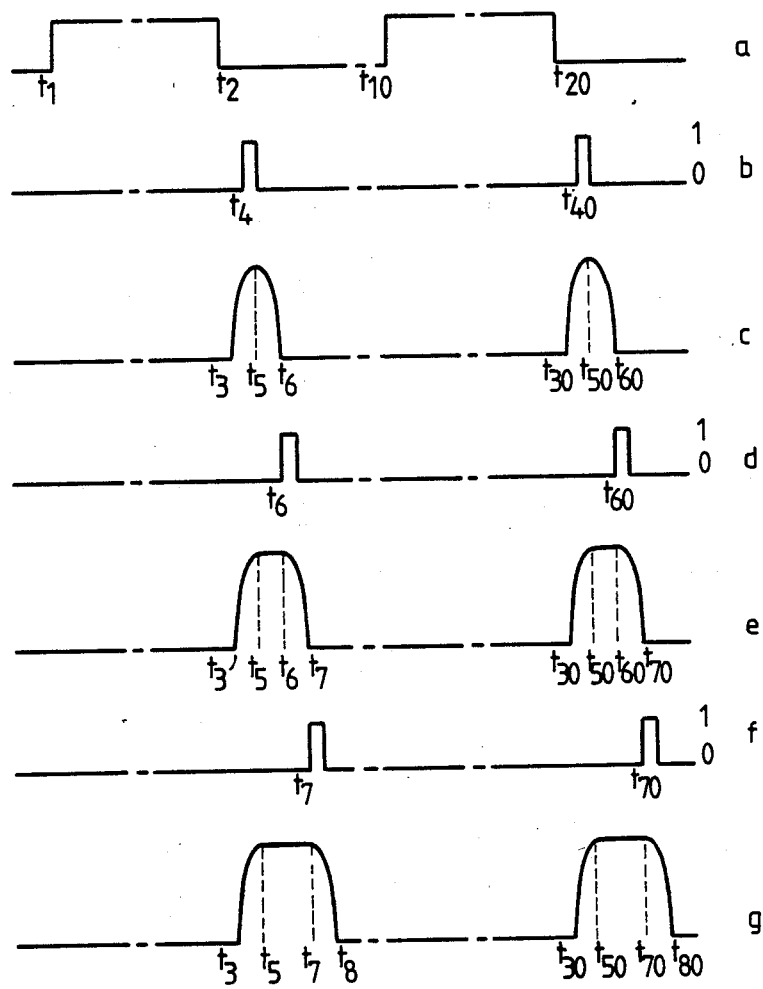
FIGS. 4a–4g show waveforms associated with the circuit of FIG. 3.

FIG. 3 shows a modification of the line deflection stage shown in FIG. 1 and corresponding reference symbols used in the two figures indicate like components. In FIG. 3, the transistor TR2 is replaced by thyristor TH and because the level of drive required to cause the thyristor TH to conduct is substantially less than that required to render transistor TR2 conducting, the drive circuitry associated with that transistor TR2 need not be required. For the purpose of the present description, it is assumed that the output of the flyback time controller TC is sufficient to drive thyristor TH. The manner of operation of the deflection circuit of FIG. 3 is substantially the same as that for FIG. 1 with the duration of the flyback pulse being controlled by the time at which thyristor TH is rendered conducting. The detailed differences in operation will be described with additional reference to FIG. 4 which shows waveforms associated with the line deflection stage of FIG. 3.

FIGS. 4a, 4c, 4e and 4g are the same as FIGS. 2a, 2c, 2e and 2g and show, as before, the output of the line oscillator LO and flyback pulses of an increasing duration. Whereas in FIG. 1, the transistor TR2 was periodically driven to provide a controlled period of non-conduction, the thyristor TH of FIG. 3 will automatically become non-conducting at or about the middle of the scan period when the polarity of the scan current reverses. Thus at the commencement of the flyback period $t_3$, $t_{30}$, thyristor TH is already non-conducting. The flyback time controller TC is therefore required to produce a short trigger pulse at those times at which thyristor TH has to be rendered conducting, in which state the thyristor TH remains until the next reversal of scan current. This is achieved by the magnitude or nature of the control voltage signal or signal applied to control input C, the input from the local oscillator LO acting as a gating pulse to prevent the flyback time controller TC from producing trigger pulses outside a given period following the start of the flyback period, for which purpose the duration of the second part $t_1$ to $t_2$, $t_{10}$ to $t_{20}$ of the line oscillator LO output may be increased relative to its first part $t_2$ to $t_{10}$. For the condition shown in FIG. 4c, the trigger pulse of FIG. 4b can commence at or prior to the peak $t_5$, $t_{50}$ of the flyback pulse to ensure that the thyristor TH conducts at the occurrence of the peak. In the case shown the pulse occurs at $t_4$, $t_{40}$. For the condition shown in FIG. 4e, the trigger pulse occurs at $t_6$, $t_{60}$ in FIG. 4d while for FIG. 4g, the trigger pulse occurs at $t_7$, $t_{70}$.

Although in the above embodiments the invention is described as related to a line deflection circuit, it will be appreciated that the invention may be employed with other arrangements that produce a sawtooth current such as a switch mode power supply.

From reading the present disclosure, other modifications will be apparent to persons skilled in the art. Such modifications may involve other features which are already known in the design, manufacture and use of arrangements and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalization thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. An arrangement for generating a sawtooth current having a stroke period and a flyback period through an inductive load, said arrangement comprising said inductive load, a storage capacitor, a unidirectional device through which said sawtooth current flows during a first part of each stroke period, a controlled switch through which said sawtooth current flows during a second part of each stroke period, a flyback capacitor connected in parallel with a main current path of said controlled switch, and a pulse source for supplying a pulse train for controlling the switching of said controlled switch, characterized in that said arrangement additionally comprises switch means by which the flyback capacitor can be electrically isolated periodically from the inductive load and the storage capacitor when the voltage across the flyback capacitor has reached its peak value and for re-connecting the flyback capacitor thereto after a finite period for extending the flyback period.

2. An arrangement as claimed in claim 1, characterized in that said switch means comprises a bipolar transistor having an emitter-collector path connected between said flyback capacitor and said inductive load, and a flyback time controller providing a pulse output for rendering said transistor non-conducting at or before a time at which said peak value is reached and conducting at said finite period after said time.

3. An arrangement as claimed in claim 2, characterized in that the pulse train from said pulse source is applied to an input of said flyback time controller, an edge in the pulse train used to switch off said controlled switch being used to produce an edge in the pulse output from said flyback time controller to render said transistor non-conducting while an edge in said pulse output to render said transistor conducting is produced in response to a further input.

4. An arrangement as claimed in claim 1, characterized in that said switch means comprises a thyristor having a main current path connected between said flyback capacitor and said inductive load, and a flyback time controller providing a trigger pulse for rendering said thyristor conducting at an end of said finite period, said thyristor having become non-conducting during the stroke period when the polarity of the sawtooth current changes.

5. An arrangement as claimed in claim 4, characterized in that the pulse train from said pulse source is applied as a gating pulse to an input of said flyback time controller, the controller producing the trigger pulse outside the period of said gating pulse.

* * * * *